United States Patent
Wang (10) Patent No.: US 12,425,024 B2
(45) Date of Patent: Sep. 23, 2025

(54) ELECTROMAGNETIC CODING SWITCH, AND ROTATION INFORMATION CALCULATION METHOD AND APPARATUS FOR ROTARY WHEEL

(71) Applicant: Shenzhen Huion Trend Technology Co., Ltd., Shenzhen (CN)

(72) Inventor: Zhouhong Wang, Shenzhen (CN)

(73) Assignee: Shenzhen Huion Trend Technology Co., Ltd., Shenzhen (CN)

( * ) Notice: Subject to any disclaimer, the term of this patent is extended or adjusted under 35 U.S.C. 154(b) by 9 days.

(21) Appl. No.: 18/697,293

(22) PCT Filed: Oct. 25, 2022

(86) PCT No.: PCT/CN2022/127357
§ 371 (c)(1),
(2) Date: Mar. 29, 2024

(87) PCT Pub. No.: WO2023/072066
PCT Pub. Date: May 4, 2023

(65) Prior Publication Data
US 2024/0405774 A1  Dec. 5, 2024

(30) Foreign Application Priority Data
Nov. 1, 2021  (CN) .......................... 202111285547.7

(51) Int. Cl.
*H03K 17/94*   (2006.01)

(52) U.S. Cl.
CPC ....... *H03K 17/94* (2013.01); *H03K 2217/009* (2013.01); *H03K 2217/94068* (2013.01)

(58) Field of Classification Search
CPC ...................................................... H03K 17/94
USPC ........................................................... 327/594
See application file for complete search history.

(56) References Cited

U.S. PATENT DOCUMENTS

2021/0041979 A1*  2/2021  Ko .......................... G06F 3/041

* cited by examiner

*Primary Examiner* — Tomi Skibinski
(74) *Attorney, Agent, or Firm* — IPro, PLLC; Na Xu (57) ABSTRACT

An electromagnetic encoding switch and a method for calculating rotation information of a runner. The electromagnetic encoding switch (10) comprises: a runner assembly (11), wherein the runner assembly (11) comprises an LC resonant circuit (111), the LC resonant circuit (111) comprising an inductor L and a capacitor C connected to the inductor L, the inductor L having a magnetic core, and the inductor L being used for receiving and transmitting electromagnetic waves; a runner (112), the LC resonant circuit (111) being disposed on the runner (112); a transceiver unit (12), the transceiver unit (12) comprising an antenna (121) disposed below the runner (112) and used for transmitting electromagnetic waves at a preset frequency in a transmitting period, so that the LC resonant circuit (111) receives energy in the transmitting period; and an antenna selection switch (122) connected to the antenna (121). The electromagnetic encoding switch (10) has no mechanical noise and is low-cost.

10 Claims, 5 Drawing Sheets

ELECTROMAGNETIC CODING SWITCH, AND ROTATION INFORMATION CALCULATION METHOD AND APPARATUS FOR ROTARY WHEEL

TECHNICAL FIELD

The present disclosure relates to the technical field of naked-eye 3D, and in particular, relates to an electromagnetic coding switch, and a rotation information calculation method and apparatus for rotary wheel.

BACKGROUND

A coding switch is an electronic switch element or device. Common coding switches include mechanical, photoelectric, and Hall-effect switches. The mechanical coding switches produce mechanical noise during use, while the photoelectric coding switches require optical sensors and demand high precision in manufacturing and assembly, leading to higher costs. The Hall-effect coding switches require multiple sets of Hall-effect switches, also leading to higher costs.

Therefore, it is an urgent problem to be solved to provide an electromagnetic coding switch, and a rotation information calculation method and apparatus for a rotary wheel.

SUMMARY OF THE PRESENT DISCLOSURE

In order to accomplish above problem of the mechanical noise and higher costs of the present coding switch, the present disclosure provides an electromagnetic coding switch, and a rotation information calculation method and apparatus for rotary wheel.

A first aspect of the present application provides an electromagnetic coding switch, including: a rotary wheel assembly, the rotary wheel assembly including an LC resonant circuit, the LC resonant circuit including an inductor L and a capacitor C connected to the inductor L, wherein the inductor L has a magnetic core and is configured to receive and transmit an electromagnetic wave, and a rotary wheel, wherein the LC resonant circuit is arranged on the rotary wheel; and a transceiver unit, including: an antenna, arranged under the rotary wheel and configured to transmit a magnetic wave at a predetermined frequency within a transmission cycle such that the LC resonant circuit receives energy within the transmission cycle, and an antenna selection switch, connected to the antenna.

A second aspect of the present application provides a rotation information calculation method for a rotary wheel, based on the electromagnetic coding switch provided by the first aspect of the present application, including: transmitting an electromagnetic wave at a predetermined frequency within a transmission cycle via an antenna arranged under a rotary wheel, such that an LC resonant circuit over the antenna receives energy; performing energy exchange by an inductor L and a capacitor C in the LC resonant circuit within a reception cycle of the antenna, and generating a free oscillation signal at a natural resonant frequency and sending the free oscillation signal to the LC resonant circuit; amplifying and analyzing the free oscillation signal received by the antenna to obtain a frequency and an amplitude of the free oscillation signal; and determining rotation information of the rotary wheel based on the frequency and the amplitude of the free oscillation signal.

A third aspect of the present application provides a rotation information calculation apparatus, comprising: a transceiver unit, configured to transmit an electromagnetic wave at a predetermined frequency within a transmission cycle via an antenna arranged under a rotary wheel, such that an LC resonant circuit over the antenna receives energy; an exchanging unit, configured to perform energy exchange by an inductor L and a capacitor C in the LC resonant circuit within a reception cycle of the antenna, and generate a free oscillation signal at a natural resonant frequency and send the free oscillation signal to the LC resonant circuit; a processing unit, configured to amplify and analyze the free oscillation signal received by the antenna to obtain a frequency and an amplitude of the free oscillation signal; and a determining unit, configured to determine rotation information of the rotary wheel based on the frequency and the amplitude of the free oscillation signal.

Compared to the related art, the rotary wheel assembly is arranged in the electromagnetic coding switch. The rotary wheel assembly includes: an LC resonant circuit, including an inductor L and a capacitor C connected to the inductor L, wherein the inductor L has a magnetic core and is configured to receive and transmit an electromagnetic wave, and a rotary wheel, wherein the LC resonant circuit is arranged on the rotary wheel; and a transceiver unit, including: an antenna, arranged under the rotary wheel and configured to transmit a magnetic wave at a predetermined frequency within a transmission cycle such that the LC resonant circuit receives energy within the transmission cycle, and an antenna selection switch, connected to the antenna. When the electromagnetic coding switch according to the present disclosure is rotated, signal transmission is implemented over electromagnetic signals, and thus no mechanical noise is produced, and the flexibility is high. Signal transmission is implemented by arranging the antenna and the LEC resonant circuits arranged on the rotary wheel. Therefore, the structure is simple and flexible, the cost is low, the usage is convenient.

DETAILED DESCRIPTION

The technical solutions in the embodiments of the present disclosure are described in detail clearly and completely hereinafter. Apparently, the described embodiments are only a portion of embodiments of the present disclosure, but not all the embodiments of the present disclosure. Based on the embodiments of the present disclosure, all other embodiments derived by persons of ordinary skill in the art without any creative efforts shall fall within the protection scope of the present disclosure.

Figure 1:
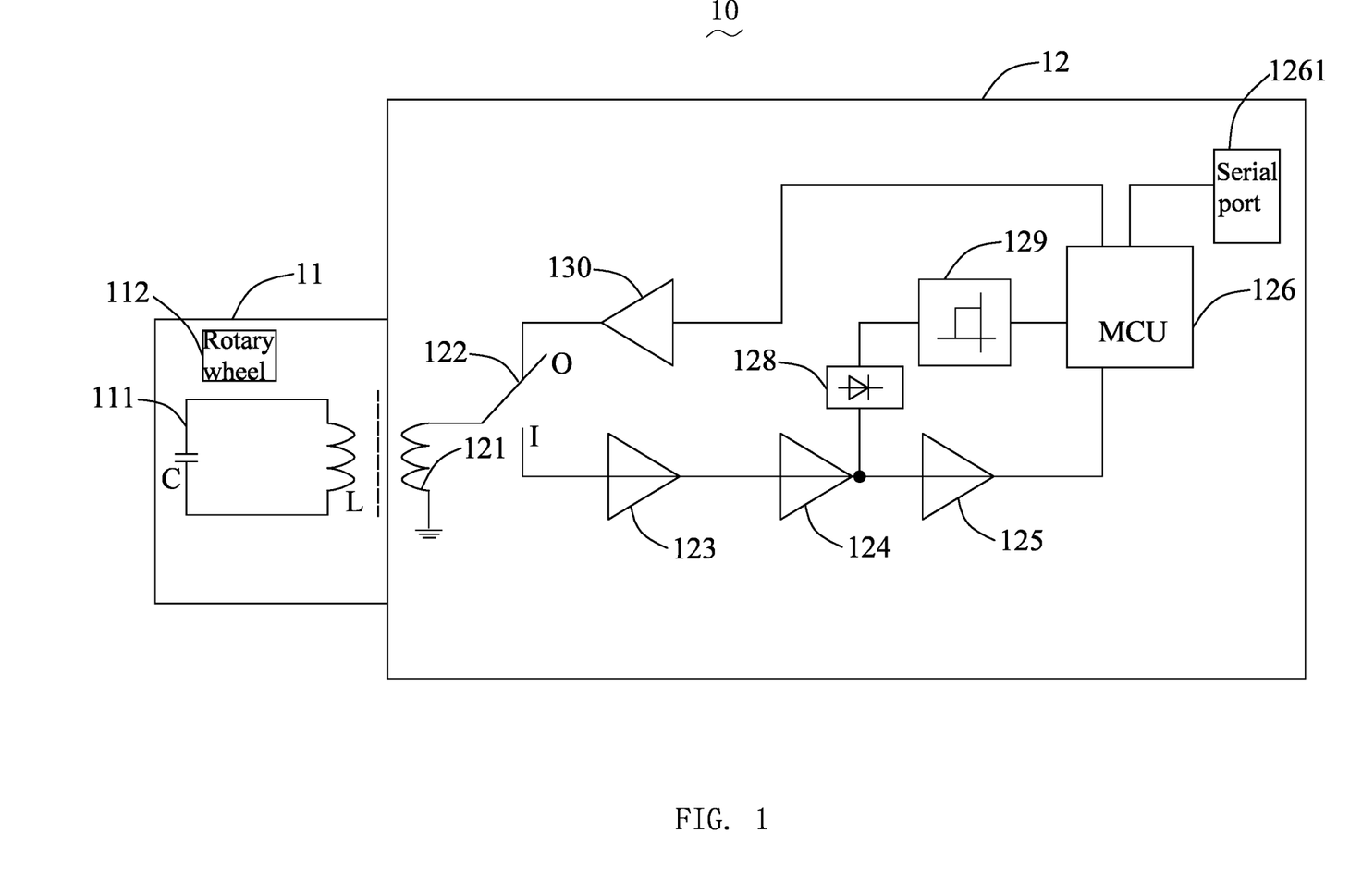
FIG. 1 is a system block diagram of an electromagnetic coding switch according to some embodiments of the present disclosure.

Referring to FIG. 1, FIG. 1 is a system block diagram of an electromagnetic coding switch 10 according to some embodiments of the present disclosure. The electromagnetic coding switch 10 includes a rotary wheel assembly 11 and a transceiver unit 12. The rotary wheel assembly 11 includes an LC resonant circuit 111 and a rotary wheel 112. The LC resonant circuit 111 includes an inductor L and a capacitor C connected to the inductor L. The inductor L has a magnetic core. The inductor L is configured to receive and transmit an electromagnetic wave. The LC resonant circuit 111 is arranged on the rotary wheel 112. The transceiver unit 12 includes an antenna 121. The antenna 121 is arranged under the rotary wheel 112, and is coupled to the inductor L and configured to transmit a magnetic wave at a predetermined frequency within a transmission cycle, such that the LC resonant circuit 111 receives energy in the transmission cycle. The antenna 121 is further configured to receive, within a reception cycle, a free oscillation signal transmitted by the LC resonant circuit 111.

In the rotary wheel assembly 11, the inductor L and the capacitor C are soldered on a printed circuit board (PCB) 1121 in the rotary wheel 112, and one to three sets of LC resonant circuits may be arranged.

In practice, the rotary wheel 112 is secured over the antenna via a bearing, such that the rotation is more stable and flexible.

A magnetic core and a coil are arranged in the inductor L.

The transceiver unit 12 further includes an antenna selection switch 122 connected to the antenna 121, a first amplifier 123, a second amplifier 124, a comparator 125 and an MCU processor 126 that are connected in series to the antenna selection switch 122, a wave detector 128 and a sampler and holder 129 that are connected in series between the second amplifier 124 and the MCU processor 126, an antenna transmit signal driver 130 connected in series between the antenna selection switch 122 and the MCU processor 126, a USB port (not illustrated) connected to the MCU processor 126, and a power management unit (not illustrated) and a charging battery (not illustrated) that are successively connected in series to the USB port (not illustrated).

In practice, the antenna 121 is formed by ring-shaped copper foil traces, and the width and shape of the copper foil determine the electrical performance of the antenna 121. The antenna 121 may be rectangle-shaped. One end of the antenna 121 is selectively connected to an input terminal of the first amplifier 123 or an output terminal of the antenna transmit signal driver 130 via the antenna selection switch 122, and the other end of the antenna 121 is grounded via the antenna selection switch 122 or directly grounded. When the antenna 121 is connected to the output terminal of the antenna transmit signal driver 130, the antenna 121 is within the transmission cycle and transmits an electromagnetic wave at a predetermined frequency to the LC resonant circuit 111; and when the antenna 121 is connected to the input terminal of the first amplifier 123, the antenna 121 is within the reception cycle and receives the electromagnetic wave resonantly transmitted by the LC resonant circuit 111.

In some exemplary embodiments of the present disclosure, the first amplifier 123 and the second amplifier 124 are both integrated amplifiers with a low-noise gain bandwidth product greater than 10 MHz. The MCU processor 126 has an analog-to-digital converter (ADC), a USB, and a serial peripheral interface (SIP), and an operating clock frequency thereof is 40 MHz. The wave detector 128 is a diode wave detection circuit. The antenna transmit signal driver 130 is an emitter follower circuit. The sampler and holder 129 is formed by an RC integrator circuit.

It should be noted that the first amplifier 123, the second amplifier 124, the comparator 125, the MCU processor, the wave detector 128, the sampler and holder 129, and the antenna transmit signal driver 130 may be integrated into a single chip, and then may communicate with a control MCU of the product via a serial port, for example, a control MCU of a digital screen, a control MCU of a digital tablet, or the like.

In some embodiments, the magnetic core of the inductor L is cylinder-shaped or H-shaped, an axis of the magnetic core of the inductor L is perpendicular to the antenna 121, the LC resonant circuit 111 is arranged on the PCB 1121 in the rotary wheel 112, and resonant frequencies of the three sets of LC resonant circuits 111 are different, for example, A, B, and C respectively. When the rotary wheel 112 is rotated, the MCU processor 125 successively receives electromagnetic waves resonantly generated by the three sets of LC resonant circuits 111. When the rotary wheel 112 is rotated along a first direction, the MCU processor 126 may detect a combination sequence ABCABCABC; and when the rotary wheel 112 is rotated along a second direction, the MCU processor 126 may detect a combination sequence ACBACBACB.

It may be understood that the three sets of LC resonant circuits 111 may be arranged at equal pitches or at irregular pitches in a ring shape around a center of circle on the PCB 1121 in the rotary wheel 112, or the three sets of LC resonant circuits 111 may be arranged on two or more concentric circles around a center of circle on the PCB 1121 in the rotary wheel 112. However, the arrangement of the three sets of LC resonant circuits is not limited herein, as long as the LC resonant circuits 111 may be resonant with the antenna 121 when the rotary wheel 112 is rotated. The number of LC resonant circuits 111 is not limited to three sets, which may be more than three sets and may be defined according to actual needs.

It should be further noted that in the present disclosure, according to actual needs, the first direction may be defined as a clockwise direction and the second direction may be defined as a counterclockwise direction; or alternatively, the first direction may be defined as a counterclockwise direction and the second direction may be defined as a clockwise direction, which are not limited herein.

Figure 2A:
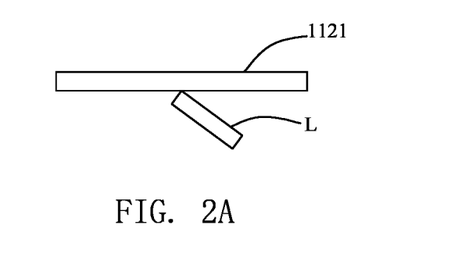
FIG. 2A is a schematic structural diagram of a magnetic core of an inductor and a PCB in a rotary wheel according to some embodiments of the present disclosure.
Figure 2B:
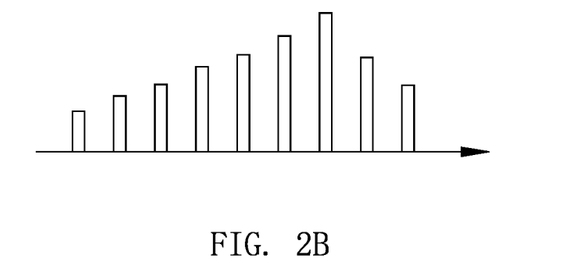
FIG. 2B and FIG. 2C are schematic diagrams of first and second amplitude variations of rotations of an electromagnetic coding switch along a first direction and along a second direction.
Figure 2C:
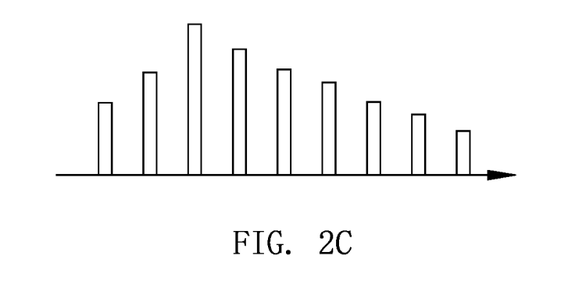

In some embodiments, the magnetic core of the inductor L is obliquely arranged on the PCB 1121 of the rotary wheel 112, and forms an acute angle with the antenna 121. As illustrated in FIG. 2A, the magnetic core of the inductor L includes a distal end and a proximal end. Since the magnetic of the inductor L is inclined, along a direction from the rotary wheel 112 to the antenna 121, the distal end is far away from the antenna 121, the proximal end is closer to the antenna 121, and the strength of a magnetic line of force passing through the magnetic core of the inductor L may vary with a distance from the magnetic core of the inductor L to the antenna 121. For example, when the rotary wheel 112 is rotated along the first direction and the distal end first enters a reception range of the antenna 121, the MCU processor 126 may detect that an amplitude variation of the free oscillation signal is a first amplitude variation, and as illustrated in FIG. 2B, the first amplitude variation is increasing from a first low amplitude to a high amplitude and then decreasing from the high amplitude to a second low amplitude; when the rotary wheel 112 is rotated along the second direction and the proximal end first enters the reception range of the antenna 121, the MCU processor 126 may detect that the amplitude variation of the free oscillation signal is a second amplitude variation, and as illustrated in FIG. 2C, the second amplitude variation is increasing from the second low amplitude to the high amplitude and then decreasing from the high amplitude to the first low amplitude, wherein the first low amplitude is less than the second low amplitude which is less than the high amplitude.

It should be noted that the first low amplitude, the second low amplitude, and the high amplitude mentioned in the present disclosure only indicate variation trends, but do not indicate that each amplitude has an equal and definite value.

Figure 2D:
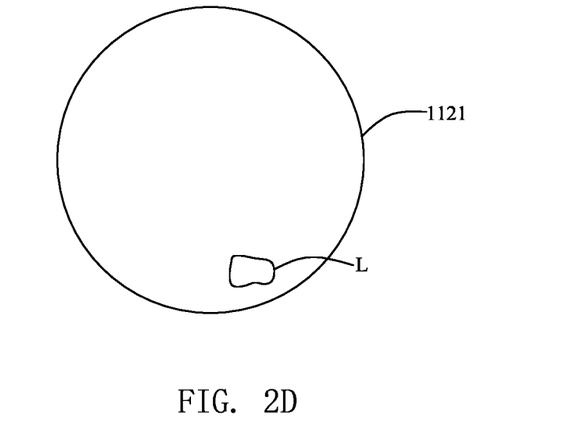
FIG. 2D is a diagram of a shape of a magnetic core of an electromagnetic coding switch according to some embodiments of the present disclosure.

Referring to FIG. 2D, a schematic diagram of a possible magnetic core according to some embodiments of the present disclosure is illustrated. The magnetic core of the inductor L is a special-shaped magnetic core. Two ends of a cross section of the special-shaped magnetic core have different sizes, including a larger end and a smaller end. Due to such configuration of the cross section of the special-shaped magnetic core, the magnetic line of force of the special-shaped magnetic core may vary with the area of the magnetic core. For example, when the rotary wheel 112 is rotated along the first direction and the smaller end first enters the reception range of the antenna 121, the MCU processor 126 may detect that the amplitude variation of the free oscillation signal is the first amplitude variation; and when the rotary wheel 112 is rotated along the second direction and the larger end first enters the reception range of the antenna 121, the MCU processor 126 may detect that the amplitude variation of the free oscillation signal is the second amplitude variation. In this way, the rotation direction of the rotary wheel 112 is determined based on the amplitude variation of the signal.

Compared to the related art, the rotary wheel assembly is arranged in the electromagnetic coding switch. The rotary wheel assembly includes: an LC resonant circuit, including an inductor L and a capacitor C connected to the inductor L, wherein the inductor L has a magnetic core and is configured to receive and transmit an electromagnetic wave, and a rotary wheel, wherein the LC resonant circuit is arranged on the rotary wheel; and a transceiver unit, including: an antenna, arranged under the rotary wheel and configured to transmit a magnetic wave at a predetermined frequency within a transmission cycle such that the LC resonant circuit receives energy within the transmission cycle, and an antenna selection switch, connected to the antenna. When the electromagnetic coding switch according to the present disclosure is rotated, signal transmission is implemented over electromagnetic signals, and thus no mechanical noise is produced, and the flexibility is high. Signal transmission is implemented by arranging the antenna and the LEC resonant circuits arranged on the rotary wheel. Therefore, the structure is simple and flexible, the cost is low, the usage is convenient, and the application scope is wide.

Figure 3:
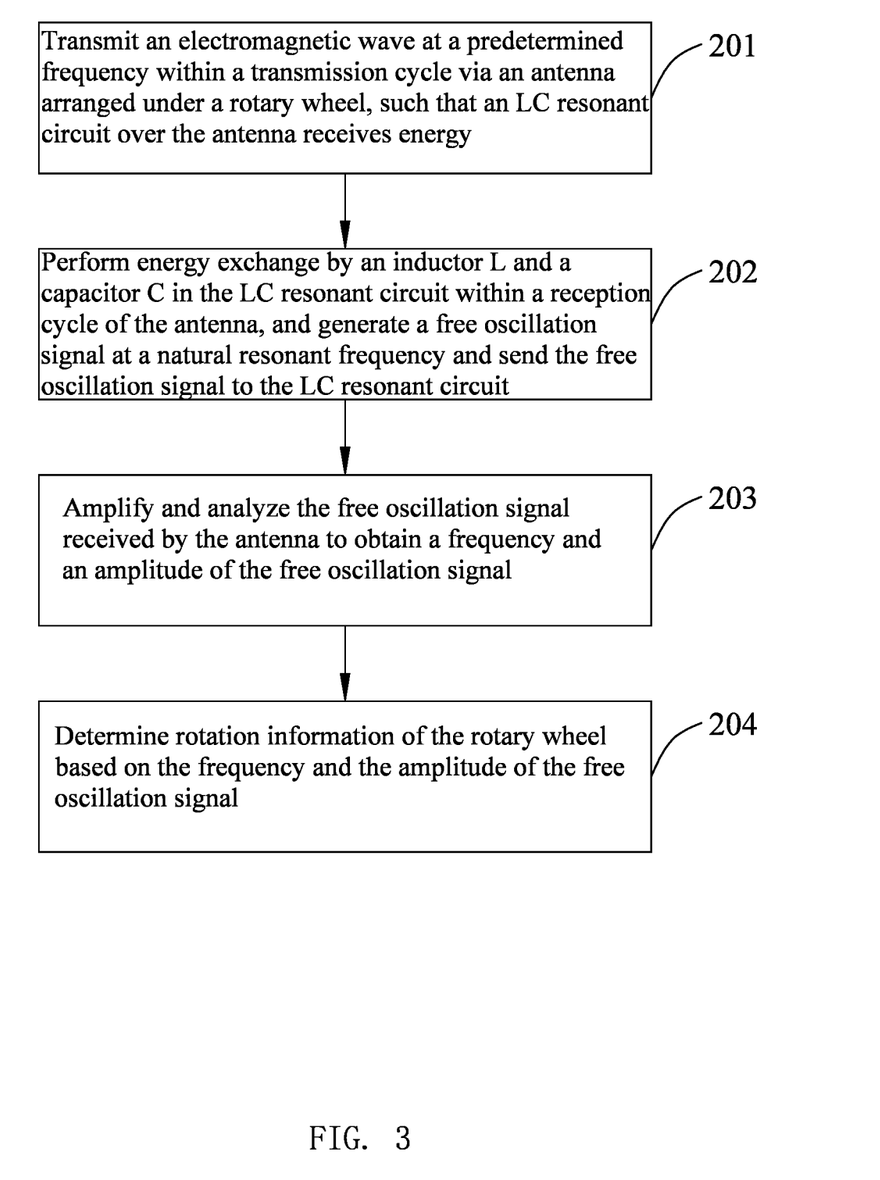
FIG. 3 is a schematic flowchart of a rotation information calculation method for a rotary wheel according to some embodiments of the present disclosure.

Some embodiments of the present disclosure provide a rotation information calculation method for a rotary wheel. The method is based on the electromagnetic coding switch as described above. Referring to FIG. 2, a schematic flowchart of a rotation information calculation method for a rotary wheel according to some embodiments of the present disclosure is illustrated. The method includes:

201, transmitting an electromagnetic wave at a predetermined frequency within a transmission cycle via an antenna arranged under a rotary wheel, such that an LC resonant circuit over the antenna receives energy;

202, performing energy exchange by an inductor L and a capacitor C in the LC resonant circuit within a reception cycle of the antenna, and generating a free oscillation signal at a natural resonant frequency and sending the free oscillation signal to the LC resonant circuit;

203, amplifying and analyzing the free oscillation signal received by the antenna to obtain a frequency and an amplitude of the free oscillation signal; and

204, determining rotation information of the rotary wheel based on the frequency and the amplitude of the free oscillation signal.

The MCU processor makes determination and calculation based on the acquired free oscillation signal, and obtains the rotation information of the rotary wheel. The rotation information includes position information and rotation speed information. It should be noted that the free oscillation signal may be a digital voltage signal, or may be an analog voltage signal, which is not limited herein.

It should be further noted that in the present disclosure the number of antennas may be one, two, or even more, and the frequencies and amplitudes of a plurality of free oscillation signals are acquired by a plurality of antennas, which is conducive to improving the detection accuracy.

The rotation information of the rotary wheel may be determined in a plurality of manners.

Manner 1: The rotation information of the rotary wheel is determined based on the frequency and the amplitude of the free oscillation signal.

Three or more than three sets of LC resonant circuits having different resonant frequencies are arranged, and the rotation information of the rotary wheel is determined based on the frequencies of the free oscillation signals of the LC resonant circuits.

Specifically, the magnetic core of the inductor L is cylinder-shaped or H-shaped, an axis of the magnetic core of the inductor L is perpendicular to the antenna, the LC resonant circuit is arranged on the PCB in the rotary wheel, resonant frequencies of the three sets of LC resonant circuits are different, for example, A, B, and C respectively. When the rotary wheel is rotated, the antenna successively receives electromagnetic waves resonantly generated by the three sets of LC resonant circuits. When the MCU processor detects a combination sequence ABCABCABC, it is determined that the rotary wheel is rotated along a first direction; and when the MCU processor detects a combination sequence ACBACBACB, it is determined that the rotary wheel is rotated along a second direction. In this way, the frequency and amplitude of the free oscillation signal are obtained, and hence the rotation information of the rotary wheel is determined.

Manner 2: The rotation information of the rotary wheel is determined based on the amplitude variation of the free oscillation signal.

1. The magnetic core of the inductor L is obliquely arranged on the PCB in the rotary wheel, and forms an acute angle with the antenna. Since the magnetic core of the inductor L is inclined, the strength of a magnetic line of force passing through the magnetic core of the inductor L may vary with a distance from the magnetic core of the inductor L to the antenna. When the magnetic core of the inductor L is rotated and enters the reception range of the antenna, the amplitude of the free oscillation signal is as illustrated in FIG. 2B or FIG. 2C. In this way, the rotation direction of the rotary wheel is determined based on the amplitude variation of the signal.

Specifically, when the MCU processor detects that the amplitude of the free oscillation signal is as illustrated in FIG. 2B, that is, the amplitude of the free oscillation signal matches the first amplitude variation, it is determined that the rotary wheel is rotated along the first direction; and when the MCU processor detects that the amplitude of the free oscillation signal is as illustrated in FIG. 2C, that is, the amplitude of the free oscillation signal matches the second amplitude variation, it is determined that the rotary wheel is rotated along the second direction.

2. The magnetic core of the inductor L is a special-shaped magnetic core. Two ends of a cross section of the special-shaped magnetic core have different sizes. Due to such configuration of the cross section of the special-shaped magnetic core, the magnetic line of force of the special-shaped magnetic core may vary with the area of the magnetic core. When the magnetic core enters the reception range of the antenna, the amplitude of an inductive signal received by the antenna may be as illustrated in FIG. 2B or FIG. 2C. In this way, the rotation direction of the rotary wheel is determined based on the amplitude variation of the signal.

Specifically, when the MCU processor detects that the amplitude of the free oscillation signal is as illustrated in FIG. 2B, that is, the amplitude of the free oscillation signal matches the first amplitude variation, it is determined that the rotary wheel is rotated along the first direction; and when the MCU processor detects that the amplitude of the free oscillation signal is as illustrated in FIG. 2C, that is, the amplitude of the free oscillation signal matches the second amplitude variation, it is determined that the rotary wheel is rotated along the second direction.

Figure 4:
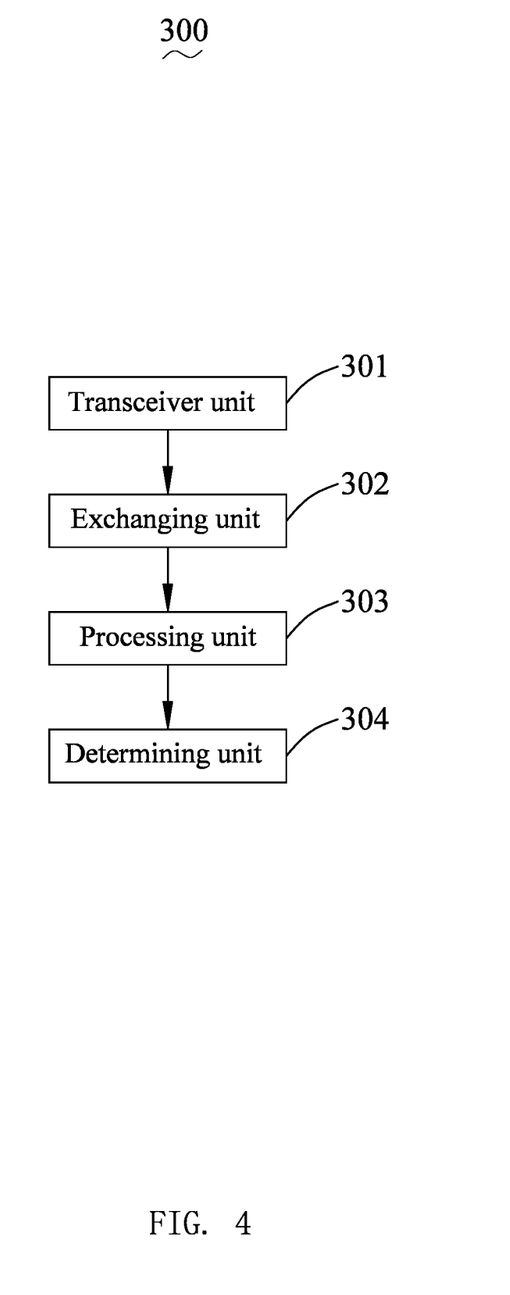
FIG. 4 is a schematic structural diagram of a rotation information calculation apparatus according to some embodiments of the present disclosure.

Some embodiments of the present disclosure further provide a rotation information calculation apparatus. Referring to FIG. 3, a schematic structural diagram of a rotation information calculation apparatus according to some embodiments of the present disclosure is illustrated. The rotation information calculation apparatus includes:

a transceiver unit 301, configured to transmit an electromagnetic wave at a predetermined frequency within a transmission cycle via an antenna arranged under a rotary wheel, such that an LC resonant circuit over the antenna receives energy;

an exchanging unit 302, configured to perform energy exchange by an inductor L and a capacitor C in the LC resonant circuit within a reception cycle of the antenna, and generate a free oscillation signal at a natural resonant frequency and send the free oscillation signal to the LC resonant circuit;

a processing unit 303, configured to amplify and analyze the free oscillation signal received by the antenna to obtain a frequency and an amplitude of the free oscillation signal; and a determining unit 304, configured to determine rotation information of the rotary wheel based on the frequency and the amplitude of the free oscillation signal.

Figure 5:
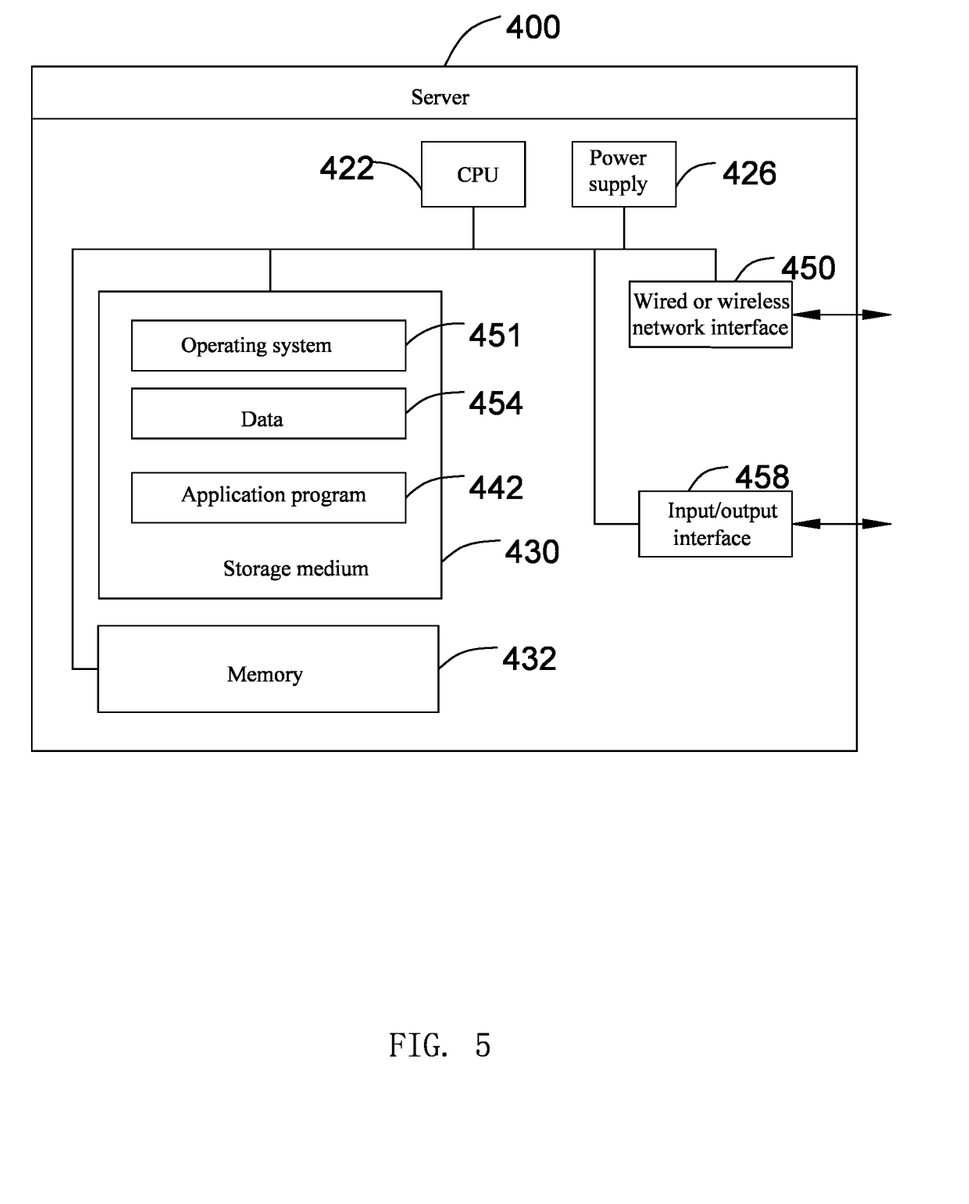
FIG. 5 is a schematic structural diagram of a server according to some embodiments of the present disclosure.

Some embodiments of the present disclosure further provide a rotation information calculation apparatus. The rotation information calculation apparatus is deployed in a server. Referring to FIG. 4, a schematic structural diagram of a server 400 according to some embodiments of the present disclosure is illustrated. The server 400 may be greatly different depending on configuration and performance. The server 400 may include one or more central processing units (CPUs) 422 (for example, one or more MCU processors), a memory 432, and one or more storage media 430 storing an application program 442 and data 454 (for example, one or more mass storage devices). The memory 432 and the storage medium 430 may be transitory memories or permanent memories. The application program stored in the storage medium 430 may include one or more modules (not illustrated), and each module may include a series of instruction operations in the server. Further, the central MCU processor 422 may be configured to communicate with the storage medium 430, and perform a series of instruction operations in the storage medium 430 on the server 400.

The server 400 may further include one or more power supplies 426, one or more wired or wireless network interfaces 450, one or more input/output interfaces 458, and/or one or more operating systems 451, for example, Windows Server™ (trademark), Mac Os X™, Unit™, Linux™, FreeBSD™, or the like.

The steps performed by the rotation information calculation apparatus according to the above embodiments may be based on the architecture of the server as illustrated in FIG. 4.

Some embodiments of the present disclosure further provide a computer-readable storage medium. The computer-readable storage medium stores at least one executable instruction. The at least one executable instruction, when loaded and executed on a computer device, causes the computer device to perform the method for calculating rotation information according to any of the above embodiments.

In the above embodiments, the technical solutions may be totally or partially practiced by software, hardware, firmware or any combination thereof. During practice by software, the technical solutions may be totally or partially implemented in the form of a computer program product.

In summary, it should be finally noted that the above-described embodiments are merely for illustration of the present disclosure, but are not intended to limit the present disclosure. Although the present disclosure is described in detail with reference to these embodiments, a person skilled in the art may also make various modifications to the technical solutions disclosed in the embodiments, or make equivalent replacements to a part of the technical features contained therein. Such modifications or replacements, made without departing from the principles of the present disclosure, shall fall within the scope of the present disclosure.

The invention claimed is:

1. An electromagnetic coding switch, comprising:
 a rotary wheel assembly, comprising:
  an LC resonant circuit, comprising an inductor L and a capacitor C connected to the inductor L, wherein the inductor L has a magnetic core and is configured to receive and transmit an electromagnetic wave, and
  a rotary wheel, wherein the LC resonant circuit is arranged on the rotary wheel; and
 a transceiver unit, comprising:
  an antenna, arranged under the rotary wheel and configured to transmit a magnetic wave at a predetermined frequency within a transmission cycle such that the LC resonant circuit receives energy within the transmission cycle, and
  an antenna selection switch, connected to the antenna.

2. The electromagnetic coding switch according to claim 1, wherein the rotary wheel assembly further comprises a bearing, wherein the rotary wheel is secured over the antenna via the bearing.

3. The electromagnetic coding switch according to claim 1, wherein the transceiver unit further comprises:

a first amplifier, a second amplifier, a comparator, an MCU processor, and a wireless module that are successively connected in series to the antenna selection switch, a wave detector and a sampler and holder that are connected in series between the second amplifier and the MCU processor, and an antenna transmit signal driver that are connected in series between the antenna selection switch and the MCU processor.

4. A rotation information calculation method for a rotary wheel, based on an electromagnetic coding switch as defined in claim 1, the method comprising:
transmitting an electromagnetic wave at a predetermined frequency within a transmission cycle via an antenna arranged under a rotary wheel, such that an LC resonant circuit over the antenna receives energy;
performing energy exchange by an inductor L and a capacitor C in the LC resonant circuit within a reception cycle of the antenna, and generating a free oscillation signal at a natural resonant frequency and sending the free oscillation signal to the LC resonant circuit;
amplifying and analyzing the free oscillation signal received by the antenna to obtain a frequency and an amplitude of the free oscillation signal; and
determining rotation information of the rotary wheel based on the frequency and the amplitude of the free oscillation signal.

5. The method according to claim 4, wherein the electromagnetic coding switch comprises three sets of LC resonant circuits, wherein the three sets of LC resonant circuits are arranged at equal pitches on a PCB in the rotary wheel, an axis of a magnetic core of the inductor L of each of the LC resonant circuits is perpendicular to the antenna, and resonant frequencies of the three sets of LC resonant circuits are different.

6. The method according to claim 5, wherein the resonant frequencies of the three sets of LC resonant circuits are respectively A, B, and C; in response to the free oscillation signal being a combination sequence ABCABCABC, it is determined that the rotary wheel is rotated along a first direction; or in response to the free oscillation signal being a combination sequence ACBACBACB, it is determined that the rotary wheel is rotated along a second direction.

7. The method according to claim 4, wherein the inductor L is obliquely arranged on the PCB in the rotary wheel.

8. The method according to claim 4, wherein the inductor L of the LC resonant circuit comprises a special-shaped magnetic core, wherein two ends of a cross section of the special-shaped magnetic core have different sizes.

9. The method according to claim 8, wherein in response to an amplitude variation of the free oscillation signal matching a first amplitude variation, it is determined that the rotary wheel is rotated along a first direction; or in response to an amplitude variation of the free oscillation signal matching a second amplitude variation, it is determined that the rotary wheel is rotated along a second direction; wherein the first amplitude variation is increasing from a first low amplitude to a high amplitude and then decreasing from the high amplitude to a second low amplitude, and the second amplitude variation is increasing from the second low amplitude to the high amplitude and then decreasing from the high amplitude to the first low amplitude, the first low amplitude being less than the second low amplitude which is less than the high amplitude.

10. A rotation information calculation apparatus, comprising:
a transceiver unit, configured to transmit an electromagnetic wave at a predetermined frequency within a transmission cycle via an antenna arranged under a rotary wheel, such that an LC resonant circuit over the antenna receives energy;
an exchanging unit, configured to perform energy exchange by an inductor L and a capacitor C in the LC resonant circuit within a reception cycle of the antenna, and generate a free oscillation signal at a natural resonant frequency and send the free oscillation signal to the LC resonant circuit;
a processing unit, configured to amplify and analyze the free oscillation signal received by the antenna to obtain a frequency and an amplitude of the free oscillation signal; and
a determining unit, configured to determine rotation information of the rotary wheel based on the frequency and the amplitude of the free oscillation signal.

* * * * *